(12) United States Patent
Schmalbein et al.

(10) Patent No.: US 6,462,546 B1
(45) Date of Patent: Oct. 8, 2002

(54) METHOD AND APPARATUS FOR INVESTIGATING THE IMPERISHABILITY OF LIQUID FOODSTUFFS BY MEANS OF ELECTRON SPIN RESONANCE

(75) Inventors: Dieter Schmalbein, Burbach (DE); JinJie Jiang, Billerica, MA (US); Arthur H. Heiss, Brookfield, CT (US); Ralph T. Weber, Watertown, MA (US); Andreas Kamlowski, Berg (DE)

(73) Assignee: Bruker Analytik GmbH, Rheinstetten-Forchheim (DE)

( * ) Notice: Subject to any disclaimer, the term of this patent is extended or adjusted under 35 U.S.C. 154(b) by 0 days.

(21) Appl. No.: 09/700,929
(22) PCT Filed: Nov. 13, 1999
(86) PCT No.: PCT/EP99/08761
§ 371 (c)(1),
(2), (4) Date: Nov. 21, 2000
(87) PCT Pub. No.: WO01/36994
PCT Pub. Date: May 25, 2001

(51) Int. Cl.[7] .................................................. G01V 3/00
(52) U.S. Cl. ....................................... 324/316; 324/317
(58) Field of Search ................................. 324/316, 317, 324/318, 321, 322; 436/24, 173

(56) References Cited

U.S. PATENT DOCUMENTS 5,811,305 A * 9/1998 Ono et al. ..................... 436/24

FOREIGN PATENT DOCUMENTS

| EP | 0 720 026 | 7/1996 |
| WO | WO 97 16750 | 5/1997 |

* cited by examiner

Primary Examiner—Louis Arana
(74) Attorney, Agent, or Firm—Weingarten, Schurgin, Gagnebin & Lebovici LLP

(57) ABSTRACT

A method and an apparatus for investigating the imperishability of n liquid foodstuffs using electron spin resonance (ESR) exposes samples of the foodstuffs to an elevated temperature for an extended time-period. At predetermined intervals during the period, the intensity of an ESR signal of each sample is measured and plotted vs. time in a diagram for that sample. The time of a superproportional increase in intensity is detected for each foodstuff. The number n of different foodstuffs is determined by dividing the predetermined interval by the measurement time. The n samples are investigated simultaneously by sequentially cycling the n samples through a common sample vessel. Each time, the intensity of the ESR signal of the sample is measured and then plotted in a diagram unique to that foodstuff. The sequence of foodstuffs are cycled through the sample vessel until a predetermined number m of measuring points per foodstuff has been attained.

34 Claims, 5 Drawing Sheets

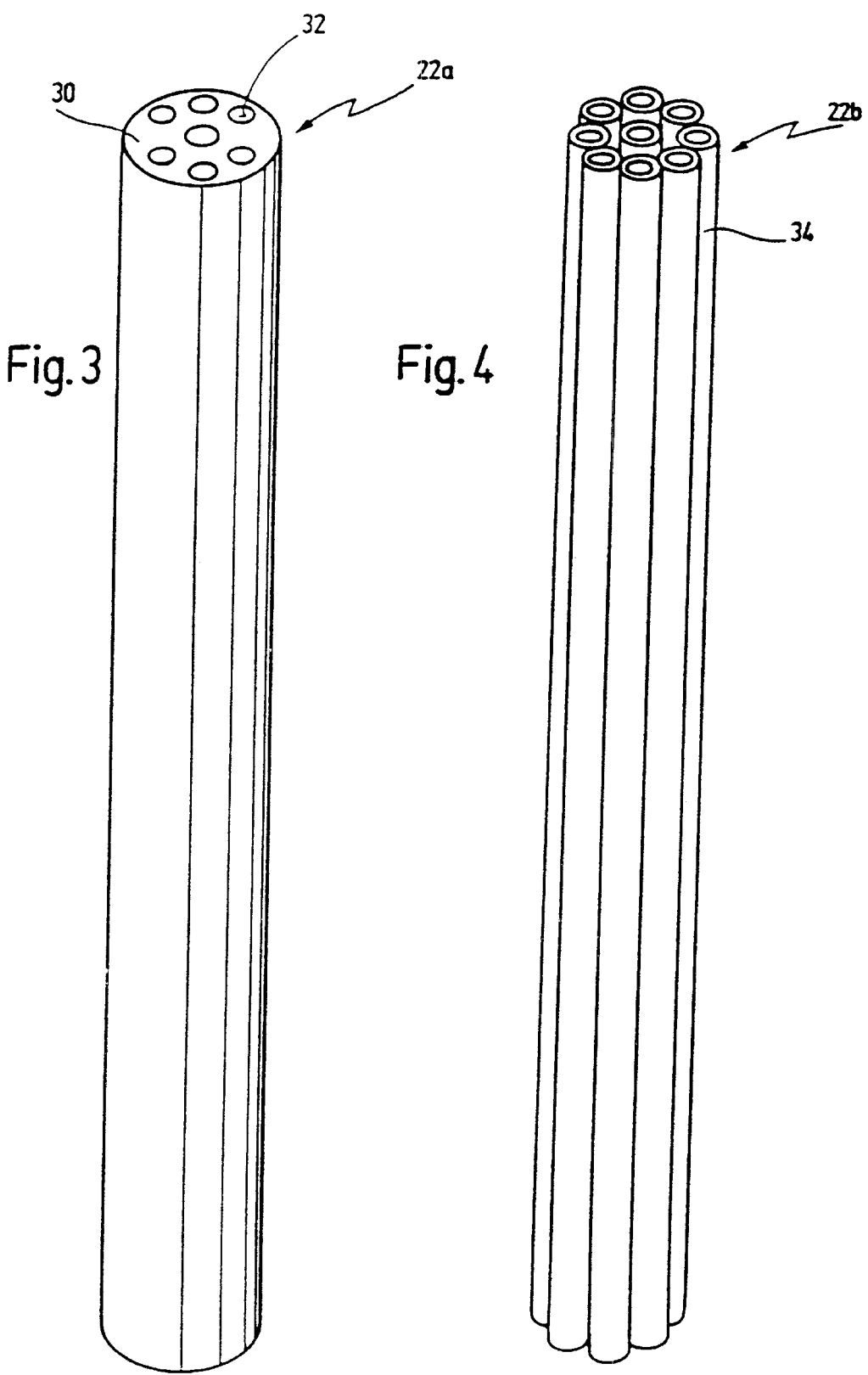

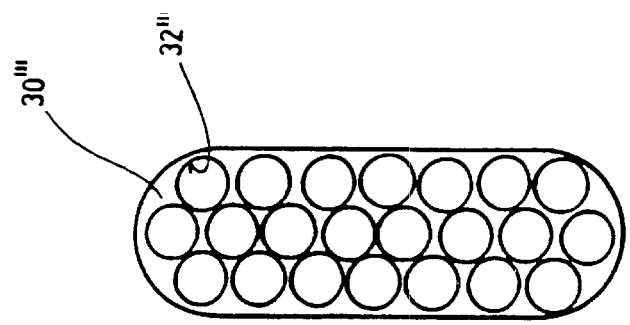
Fig. 8
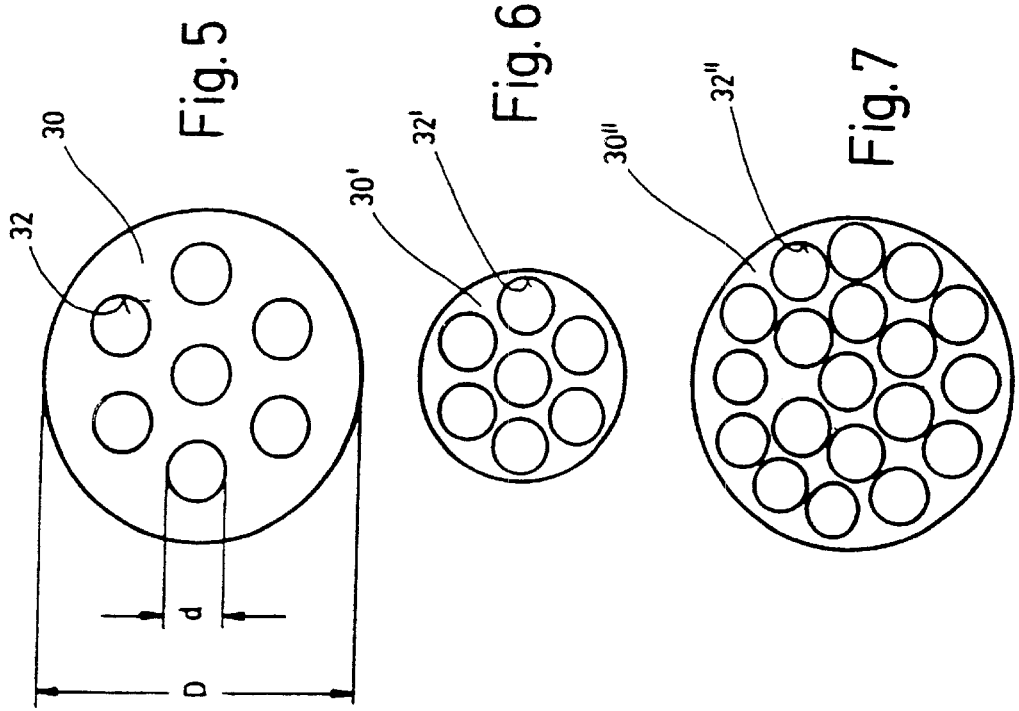
Fig. 5
Fig. 6
Fig. 7

METHOD AND APPARATUS FOR INVESTIGATING THE IMPERISHABILITY OF LIQUID FOODSTUFFS BY MEANS OF ELECTRON SPIN RESONANCE

The invention is related to a method for investigating the imperishability of liquid foodstuffs by means of electron spin resonance (ESR), wherein a sample of the foodstuff is exposed to an elevated temperature, as compared to room temperature, for an extended period of time, wherein during the period of time an ESR signal of the sample is measured in predetermined time intervals, the intensity of the ESR signal is plotted vs. time and the moment in time is detected when the intensity shows a superproportional increase.

The invention is, further, related to an apparatus for investigating the imperishability of liquid foodstuffs by means of electron spin resonance (ESR), wherein a sample of the foodstuff is exposed to an elevated temperature, as compared to room temperature, for an extended period of time, wherein during the period of time an ESR signal of the sample is measured in predetermined time intervals, the intensity of the ESR signal is plotted vs. time and the moment in time is detected when the intensity shows a superproportional increase.

When doing so, the samples are provided with a so-called spin-trap-substance or a spin-label-substance or a corresponding intrinsic substance is already comprised in the sample anyhow.

A method of the afore-mentioned kind is disclosed in an article by Kaneda, H. et al. "Free Radical Reactions in Beer during Pasteurization", International Journal of Food Science and Technology (1994), 29, pp. 195 to 200. A corresponding method as well as an apparatus for executing same is also disclosed in EP 0 720 026 A2. Still another description of such a method together with a corresponding apparatus may be found in an application note by Barr, D. "Measuring Flavor Stability of Beer using the Bruker EMX Spectrometer", Bruker EPR Application Note (1998).

For a better understanding of the present method the underlying measuring technology of electron spin resonance shall be briefly discussed.

Electron spin resonance (ESR) is a partial field within the general field of magnetic resonance. In ESR, a sample substance is simultaneously exposed to a high frequency electromagnetic field as well as to a strong constant magnetic field of high homogeneity. By varying the field strength of the constant magnetic field various electron spin resonances are excited within the sample and may be plotted as a spectrum. Typically a high frequency electromagnetic field within X-band, i.e. at about 10 GHz is utilized, which means that the strength of the constant magnetic field is about 0.32 T. It is, however, also known to conduct ESR measurements on the one hand at frequencies being ten times as high or, on the other hand, being only one tenth of the afore-mentioned frequeny.

As mentioned before, for exciting ESR it is only necessary to expose the sample substance to a magnetic high frequency field. When the measuring frequencies are within the microwave range, hollow cavities are conventionally utilized for that purpose. Such cavities are mostly rectangular cavities of the oscillation mode $TE_{10n}$, however, in some instances also cylindrical cavities of the oscillation mode $TE_{011}$ are utilized.

Such rectangular cavities are conventionally configured in double length, i.e. as $TE_{102}$ cavities. The sample container having the shape of a sample tube is then inserted at the cavity center where the H-lines of both oscillation loops extend parallel to each other. In such a situation the sample, is, hence, located within the area of maximum magnetic high frequency field strength. Due to the characteristics of such oscillation mode, this is also the area of minimum electric high frequency field strength. This is of particular advantage for lossy samples because in such a way the dielectric losses are at a minimum.

When liquid samples are to be investigated with ESR measurements, one has to bear in mind that such samples per se are subject to substantial dielectric losses. One has, therefore, to take care that the liquid sample substance is as much as possible arranged within the plane within which the magnetic high frequency field strength is at a maximum and the electric high frequency field strength is at a minimum. For achieving that one may either utilize one single thin capillary, however, it is also well known to utilize so-called "flat cells", i.e. sample tubes which have been flattened within the measuring area. By doing so the liquid sample substance is essentially distributed within an area so that one may place relatively much sample substance within the afore-mentioned plane of maximum magnetic and minimum electric high frequency field strength.

Sample heads of the afore-mentioned kind are generally known and are also commercially available from the competent manufacturers.

It is, furthermore, well known in the field of magnetic resonance to arrange a plurality of different samples within independent vessels or at least at individual locations within the same probe head being distant from each other, for conducting comparative measurements. By doing so one may either conduct direct comparative measurements between two sample substances or one may utilize one of the substances, being a reference substance, as a standard, whereas only the other substance is investigated. This standard may be utilized for quantitative scaling purposes or one may use same for effecting a field control (so-called "internal lock"). Within this context various probe heads have been disclosed, permitting that two distinct sample substances are received within a sample area or within two independent sample areas, respectively.

An example of such a prior art probe head is disclosed in an article by DALAL et al. "The effects of lossy solvents on quantitative EPR studies", Journal of Magnetic Resonance, 44, pp. 415–428 (1981).

In this prior art probe head (cf. FIG. 3 in the afore-mentioned article) a sample tube arrangement is utilized in which within a thin-walled NMR-sample tube of 0.5 cm outer diameter a first capillary having an inner radius of 0.05 cm and, either a quartz tube having a radius of 0.064 cm or another capillary having an inner radius of 0.05 cm are utilized. The first capillary contains the sample substance being dissolved within a non-lossy solvent as a reference substance, whereas the second capillary or the tube contains the lossy solvent being conventionally used. Both samples may be arranged within the plane of minimum electric high frequency field strength.

U.S. patent specification No. 5,552,709 discloses a probe head for nuclear magnetic resonance (NMR). This prior art probe head is of elongate design and comprises a plurality of parallel capillaries. The capillary walls consist of a non-conductive material so that the quality factor Q of the resonance system shall be increased by reducing the electrical losses caused by currents flowing radially with respect to the sample container axis.

In another sample container for an NMR-spectrometer, as disclosed in U.S. Pat. specification No. 5,469,061 a plurality of laterally adjacent capillaries is likewise used as a sample container. These capillaries are switched in series such that a flow cell is configured in which the liquid sample substance enters through one capillary, then flows through all of the remaining capillaries under repetitive change of flow direction and, finally, is discharged from another capillary.

Finally, U.S. Pat. specification No. 5,596,276 discloses a standard rectangular cavity as used for electron spin resonance spectrometers.

The afore-mentioned probe heads, therefore, are exclusively intended to be used for making comparative measurements between two samples, one of which being conventionally known for reference purposes.

While ESR measurements on liquid samples have only played a secondary role in the past, because ESR was mostly used as an analytical instrument in connection with solids, various applications have gained attention in the recent past in which ESR was utilized on liquid samples.

One of these applications is the investigation of the imperishability of beer. One has found that the aging of beer, in particular the so-called "turning sour" of beer into a condition where it may no more be consumed, is caused by the generation of various aldehydes being side products of reactions in which free radicals are involved. These are processes being comparable to those that also occur in other foodstuffs, for example meat and dairy products.

The behavior of free radicals is in so far highly depending on temperature, wherein processes develop the slower, the lower the storage temperature, for example of beer, is. It is known that beer comprises naturally abundant antioxidants counteracting the afore-mentioned free radicals within such processes. By means of ESR it is possible to investigate the behavior of free radicals, by utilizing the so-called "spin-trapping" or the "spin-labelling" method. Within this method a beer sample is first de-gassed and, subsequently, a "spin-trapping" or a "spin-labelling" substance, respectively, is added. The beer sample thus configured is then subjected to a thermal stress program by bringing same to an elevated temperature of e.g. 60° C., for thus imitating the aging process in quick motion. By periodically measuring ESR, e.g. every ten minutes, the aging process within the beer may be monitored. By doing so it is possible within a relatively short period of time to find an indication about whether the investigated beer will perish sooner or later. This, again, allows to influence the brewing process by repeatedly measuring in the afore-mentioned way for finally extending the imperishability of the beer. In other sample materials the respective substances are already abundant as intrinsic substances.

The afore-mentioned method is disclosed with further details in the articles of Hirotaka and Barr, mentioned at the outset, as well as in EP 0 720 026 A2 so that reference may be made to these publications insofar.

In order to use ESR measurements on liquid samples, for example in the afore-described application (investigation of imperishability of foodstuffs, or of fermented liquids, especially beer or e.g. wine or dairy products), it is necessary to work with relatively large sample quantities in order to obtain sufficiently high signals as soon as possible. Moreover, the respective method shall allow an automatic execution on a large scale.

With the prior art probe heads for ESR spectrometers allowing measurements on liquid samples, this is not easily possible because these probe heads are normally apparatuses to be used in scientific laboratories, being difficult to handle and requiring a high amount of skill and, in particular, a considerable measuring time.

A significant disadvantage of the prior art method and the corresponding apparatus as described in the three printed publications mentioned at the outset, is that a substantial period of time is necessary for conducting the measurements. It may be that the required amount of time is tolerable for the measurement of one single kind of beer (in order to keep on with this example), the required amount of time is nor more tolerable when a plurality of samples of different foodstuffs (beers) is intended to be measured. This may, e.g. be the case in a large brewery where beers of same or distinct beer kinds being brewed in different tanks shall be monitored continuously during the fermentation process, for if need be, influencing the fermentation process in order to achieve the forecasted imperishability of the beer.

If the prior art method and apparatus were used e.g. for measuring six different samples of distinct foodstuffs (beers) a measuring time corresponding to six times the time of a single measurement would be required. Considering, however, that already a simple measurement requires a period of time of the order of one hour, a measuring result would be available only after several hours. However, then it would already be too late for influencing the production process (fermentation process) of the foodstuff.

Of course, it would be possible in such instances to multiply the number of measuring apparatuses. However, this option may be eliminated due to economical considerations because ESR spectrometers are highly complex, and, hence, very expensive measuring instruments.

It is, therefore, an object underlying the invention to improve a method and an apparatus of the type specified at the outset, such that simultaneous measurements on a plurality of samples becomes possible such that different foodstuffs (beers) may be measured almost parallel in time without the necessity of providing further measuring installations therefore.

In a method of the type specified at the outset, this object is achieved according to the invention in that a predetermined number n of samples of different foodstuffs is investigated simultaneously by executing the following steps within a common sample vessel:

a) filling a first sample of a first foodstuff into the sample vessel;

b) investigating the first sample by means of ESR and measuring the intensity of the ESR signal;

c) plotting the intensity measured in step b) as a first measuring point in a first diagram;

d) discharging the first sample;

e) repeating n−1 times steps a) through d) with the n−1 samples of the other foodstuffs, wherein in step c) the measured intensities of each foodstuff are plotted into separate diagrams as first points, the number n being dimensioned such that executing steps a) through d) n times corresponds essentially to the predetermined time interval;

f) filling another first sample of the first foodstuff into the sample vessel;

g) investigating the further first sample by means of ESR and measuring the intensity of the ESR signal;

h) plotting the intensity measured in step g) as a second measuring point into the first diagram;

i) discharging the further first sample;

j) repeating n−1 times steps e) through i) with the n−1 samples of the other foodstuffs, wherein in step h) the measured intensities of each foodstuff are plotted into separate diagrams as second points into the separate diagrams; and k) repeating steps e) through j) for third and more measuring points until a predetermined number m of measuring points per diagram has been attained.

In an apparatus of the type specified at the outset, the object underlying the invention is achieved in that for simultaneously investigating a predetermined number n of samples of different foodstuffs a common sample vessel is provided and that the apparatus comprises:

a) means for filling a first sample of a first foodstuff into the sample vessel;

b) means for investigating the first sample by means of ESR and measuring the intensity of the ESR signal;

c) means for plotting the intensity measured in step b) as a first measuring point in a first diagram;

d) means for discharging the first sample;

e) means for repeating n−1 times steps a) through d) with the n−1 samples of the other foodstuffs, wherein in step c) the measured intensities of each foodstuff are plotted into separate diagrams as first points, the number n being dimensioned such that executing steps a) through d) n times corresponds essentially to the predetermined time interval;

f) means for filling another first sample of the first foodstuff into the sample vessel;

g) means for investigating the further first sample by means of ESR and measuring the intensity of the ESR signal;

h) means for plotting the intensity measured in step g) as a second measuring point into the first diagram;

i) means for discharging the further first sample;

j) means for repeating n−1 times steps e) through i) with the n−1 sample s of the other foodstuffs, wherein in step h) the measured intensities of each foodstuff are plotted into separate diagrams as second points into the separate diagrams; and k) means for repeating steps e) through j) for third and more measuring points until a predetermined number m of measuring points per diagram has been attained.

It had already been mentioned that a spin-trap substance or a spin-label substance or a corresponding intrinsic substance was added to the sample beforehand.

The object underlying the invention is thus entirely solved.

During the execution of the inventive method and during the use of the inventive apparatus, respectively, a substantial gain in time is obtained, as compared with conventional measurements. The measurements on the individual samples are namely interlocked in time relative to each other with the smallest possible time-offset, such that the entire measuring time is only a little bit longer as the conventional measuring time for one sample. According to the invention, the trick is to utilize the intermission between two individual measurements on the sample in conventional measurements.

Therefore, although only a minimum complication of the apparatus is required, one may measure a plurality of samples of distinct foodstuffs practically parallel in time with one single ESR spectrometer.

According to a first alternative of the invention, the samples are recirculated after discharging so that, in other words, always the same samples are measured within predetermined time intervals.

However, on the other hand it is also possible to dispose of the samples after discharging such that the samples of a specific foodstuff are taken as individual samples from a supply of the specific foodstuff.

Whereas in the first-mentioned case the apparatus has to be configured a little bit more complicated, only a very small amount of sample is required on the other hand because the same sample is repeatedly measured. This is possible because electron spin resonance is a non-destructive measuring technique.

According to the second mentioned alternative, the apparatus may be configured more simple, however, a larger amount of sample material must be at hand, namely a volume of sample material being bigger by a factor corresponding to the number of planet measuring points.

According to another embodiment of the invention the sample vessel is preferably rinsed after each individual measurement.

This measure has the advantage that errors within the measuring values are avoided which may possibly be caused by the fact that after the discharge of a single sample residual amounts of that sample will remain within the sample vessel.

Within the scope of the present invention it is particularly preferred when the samples are measured within a resonator adapted to allow propagation of an electromagnetic field, the sample container being elongate and being located within the resonator along the direction of the magnetic high frequency or radio frequency (RF) field strength at the location of minimum electric RF field strength, that the foodstuffs sample contained in the sample container has minimum dimensions in the direction of increasing electric RF field strength, and that the samples are measured in a sample container having a plurality of elongate sample areas with minimum radial dimensions.

This measure has the advantage that measurements may be conducted with minimum dielectric losses corresponding to a high quality factor of the measuring circuit. This is particularly important in connection with the very narrow-band measuring circuits (resonators) as used in electron spin resonance spectroscopy because already relatively small dielectric losses will result in a dramatic decrease of the quality factor Q. This distinguishes electron spin resonance fundamentally from nuclear resonance utilizing resonators configured as coils having an essentially lower quality factor such that electric losses will influence the quality factor to a much lesser extend.

In further embodiments of the invention the sample areas are arranged parallel and the sample is filled into one end of the sample areas and is discharged from the opposite end of the sample areas.

As an alternative, the sample areas may be arranged in series, the sample is filled into an open end of the first sample area within the series and is discharged from the open end of the last sample area within the series.

Both alternatives have the advantage of a flow cell being particularly adapted for ESR measurements on liquid samples because due to the thin capillaries used only very small dielectric losses occur.

Insofar one has to state that surprisingly the electromagnetic losses being caused by a liquid sample in an ESR probehead do not quite only depend on the amount of sample material and on the positioning of the sample material within the resonator. Instead, one has found that the negative influence of these losses may be drastically reduced by distributing the desired entire sample substance over a plurality of individual amounts of sample and by placing same individually into elongate sample areas within the resonator. Due to the particular field distribution within the resonator and due to the spin effects resulting therefrom and due to the extremely small radial conductive paths within the liquid sample material, the losses are substantially reduced.

The electromagnetic losses being effective in this regard do not only comprise the well-known dielectric losses. In addition, one has to bear in mind that the magnetic component of the electromagnetic high frequency field also generates eddy currents. These shall be avoided or minimized, respectively, as best as one can. In a conductive liquid the magnetic high frequency field namely results in shielding currents about the field direction, namely essentially at the corresponding sample surface. Due to these shielding currents the intended penetration of the magnetic field into the interior of the sample is rendered more difficult which, in turn, results in a signal decrease. If, however, the sample is segmented, e.g. by subdividing same into filaments, the eddy currents are interrupted. This, in turn, results in an increase penetration of the magnetic field into the interior of the sample and, hence, in a signal enhancement.

As a consequence, due to the invention the quality factor of the resonator is much less influenced as before which, finally, has the result that with a relatively large amount of sample substance a corresponding strong measuring signal may be used.

This opens up entirely new fields of applications within industrial production processes because it is no more necessary to prepare a sample with utmost precision. Instead relatively simple apparatuses and less skilled personal are sufficient to conduct quantitatively sufficient measurements.

Therefore, the invention may, further, be used with advantage in a method of the type specified at the outset for investigating liquid samples, when a probe head of the afore-mentioned kind is utilized. As already mentioned before, this holds true, for example, for applications as the investigation of the imperishability of liquid and solid foodstuffs, in particular drinks, preferably beer.

In a preferred embodiment of the inventive probe head the probe head comprises a block being provided with a plurality of axial bores.

This measure has the advantage that a stable and reproducible sample container is available which may be handled, filled and discharged simply.

The block is preferably essentially cylindrical, however, in other embodiments of the invention may also be essentially flat.

As an alternative instead of using a block provided with bores one may also be utilize a bundle of capillaries.

This measure has the advantage that capillaries are industrially available as finished elements so that the mentioned bundles of capillaries may be produced relatively simply and at low cost.

With probe heads of the mentioned type it is particularly preferred when the ratio of the sum of the radial cross-sectional areas of the sample areas and the entire cross-sectional area of the sample vessel is between 0.2 and 0.6.

This ratio has turned out to be optimal both with respect to the maximization of the sample volume and with respect to the stability of the sample vessel.

The sample areas are preferably essentially cylindrical.

This measure has the advantage that the sample vessels may be manufactured relatively easily.

If the probe head is operated at a conventional ESR measuring frequency within the X-band, e.g. at 10 GHz, the diameter of the sample areas is between 0.3 and 1.0 mm, preferably between 0.5 and 0.8 mm.

In that case, it is further, preferred when for an essentially cylindrical sample vessel the outer diameter is between 2.5 and 5 mm preferably between 2.8 and 3.8 mm.

It goes without saying that these dimensions are related to the mentioned frequency band, whereas for lower frequencies (e.g. S-band) or for much higher frequencies (Q-band or V-band) the dimensions must be selected correspondingly larger or smaller, respectively.

For the afore-mentioned configurations it is, further preferred when the cylindrical sample areas within the cylindrical probe head are arranged along the so-called hexagonal densest packing, i.e. when either seven or nineteen sample areas are arranged about a center axis.

In a further embodiment of the invention a pump is connected to the discharge end of the sample areas. This measure has the advantage that the filling and the discharging of the sample areas within the sample vessel may be effected reliably and quickly.

This holds true in particular when the pump is a peristaltic pump.

In further embodiments of the invention it is preferred when the filling-in end of the sample areas is connected to the output of a sampler, and inputs of the sampler are connected to a plurality of containers being filled with different foodstuffs.

This measure has the advantage that the sequential filling of the sample areas of the sample vessel with samples of distinct foodstuffs is effected in an automatized and remote-controlled way.

With this embodiment of the invention one may, finally, provide that a further input of the sampler is connected to a vessel adapted to be filled with a rinsing liquid.

This measure has the advantage that after each measuring process, as mentioned above, a rinsing process may take place for cleaning the sample areas of the sample vessel.

Further advantages will become apparent from the description and the enclosed drawing.

It goes without saying that the features mentioned before and those that will be mentioned here and after may not only be used in the particularly given combination, but also in other combinations or alone without leaving the scope of the present invention.

Embodiments of the invention are shown in the drawing and will be explained in further detail throughout the subsequent description.

Figure 1:
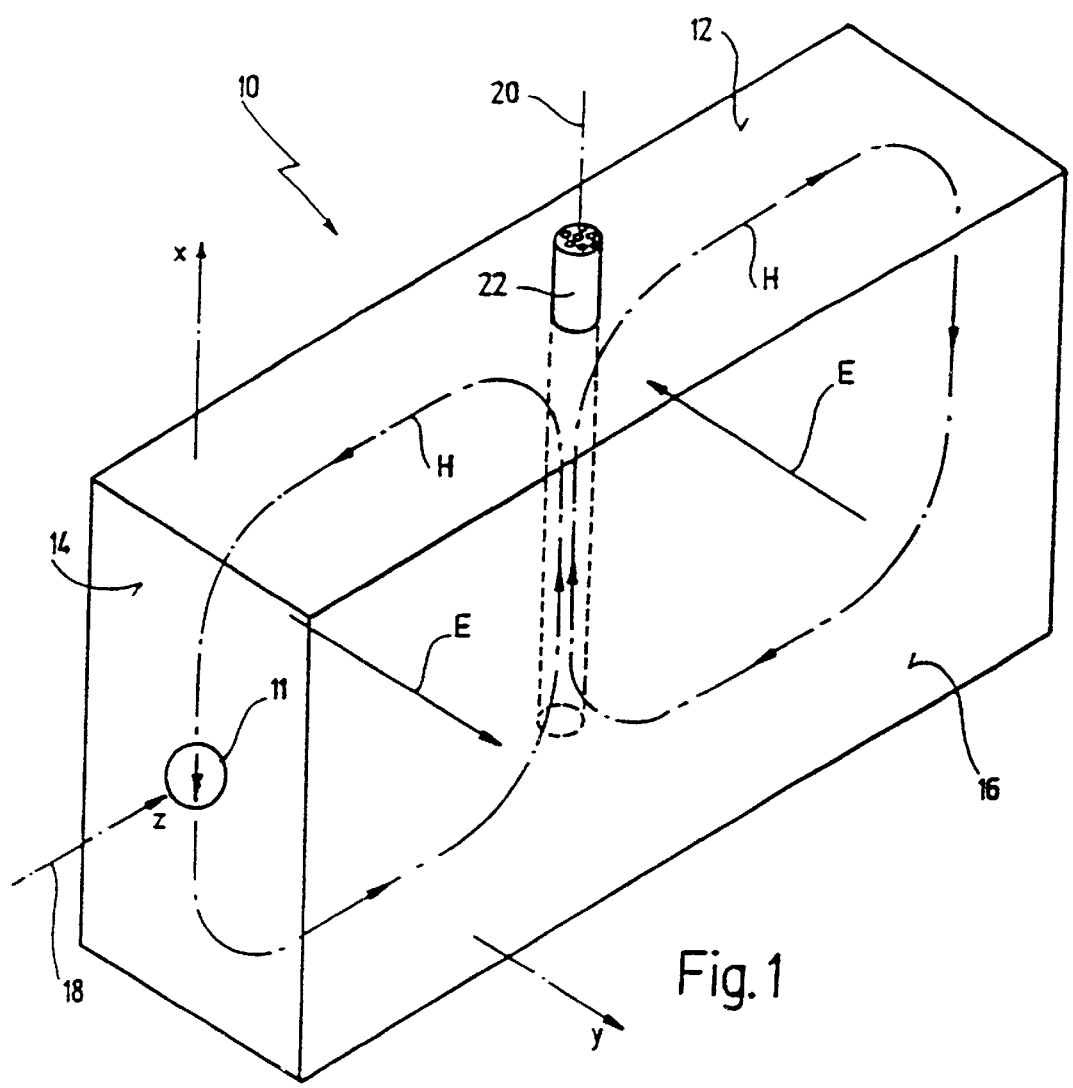
FIG. 1 shows a highly schematic view of an embodiment of an inventive probe head.
Figure 9:
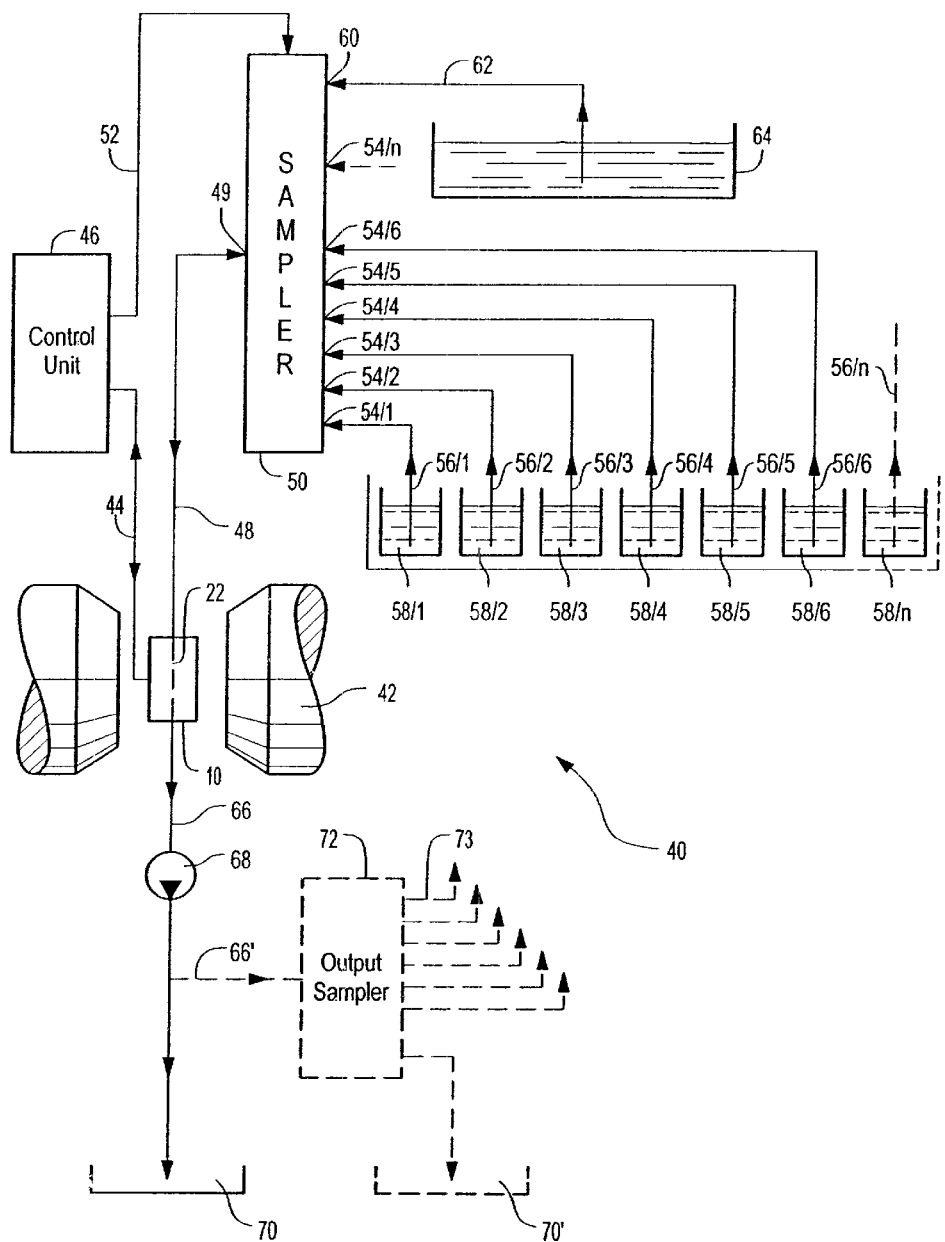

FIG. 3 on a highly enlarged scale shows a sample vessel as may be used in the probehead of FIG. 1;

FIG. 4 shows an alternate embodiment for the depiction of FIG. 3;

FIGS. 5 to 7 show a top plan view on the sample vessel of FIG. 3 in three distinct alternate embodiments;

FIG. 8 shows another depiction, similar to the that of FIG. 5 to 7, however, for a further modified embodiment;

FIG. 9 shows a block diagram of an embodiment of an inventive apparatus;

FIGS. 10a to 10g show diagrams for explaining an embodiment of the inventive method.

FIG. 1 shows a rectangular hollow cavity resonator of the oscillation mode $TE_{102}$, as is conventionally used for ESR measurements. Resonator 10 is coupled to a microwave line (not shown) via a coupling iris 11. An electromagnetic oscillation of the $TE_{10}$ mode will then propagate within resonator 10. As the length of resonator 10 is properly dimensioned, a resonance oscillation mode $TE_{102}$ is generated. In FIG. 1 the field lines of the magnetic high frequency field are designated as H and those of the electric high frequency field with E.

The rectangular resonator 10 has two lateral sides 12, two narrow sides 14 and two broad sides 16. The longitudinal axis is designated with 18.

As one may easily see, the H field lines extend parallel to broad sides 16 whereas the E field lines extend perpendicularly thereto. A sample axis 20 lies within the center of lateral side 12. A sample container 22 may be inserted into resonator 10 along probe axis 20.

Figure 2:
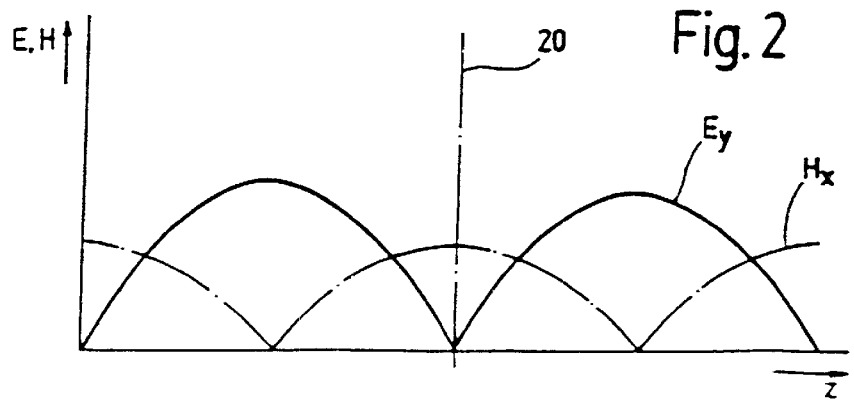
FIG. 2 shows the diagram of the electric and the magnetic high frequency field strength along the longitudinal axis of a rectangular cavity of the oscillation mode $TE_{102}$, as used within the probe head of FIG. 1.

As one may see from the diagram of FIG. 2 the magnetic high frequency field strength $H_x$, acting along the x-direction has maximum within the area of sample axis 20, whereas the electric high frequency field strength $E_y$ acting along the Y-direction has a distinct minimum at sample axis 20.

This is not so important for solid measuring samples because the dielectric losses in solids are relatively low. For lossy liquid measuring samples, however, the dielectric losses are distinctly higher so that in conventional resonators extremely thin capillaries are used as sample containers or so-called "flat cells" arranged in a plane parallel to narrow side 14. Only by doing so it becomes possible that the sample substance is located almost entirely within the area of minimum $E_y$. Even if the sample substance is placed a little bit outside that point of minimum electric high frequency field strength, dielectric losses occur that are distinctly measured. These losses result in a drastic decrease of the quality factor Q of the hollow cavity and, hence, to a significant deterioration of the measuring result.

According to the invention, the sample vessel 22 is configured such as to comprise a plurality of elongate sample areas which, in the embodiment shown extend parallel to sample axis 20.

As an example, FIG. 3 on a highly enlarged scale shows a sample vessel 22a consisting of a massive block. The block may, e.g. consist of quartz. A plurality of bores 32 is provided within the block and parallel to its axis.

As an alternative, as shown in FIG. 4, a bundle of capillaries 34 may likewise be combined to configure a sample vessel 22b.

FIGS. 5 through 7 in a top plan view show some conceivable configurations for bores 32, wherein the same would hold true for the capillaries 34.

In the embodiment of FIG. 5 seven bores 32 are altogether provided in block 30 within a hexagonally densest packing. The outer diameter D of block 30 may be between 2.5 and 5 mm, preferably between 2.8 and 3.8 mm, wherein the diameter d of bores 32 may be between e.g. 0.3 and 1.0 mm preferably between 0.5 and 0.8 mm. These dimensions are related to a measuring frequency within X-band, e.g. at 10 GHz.

In the alternate embodiment of FIG. 6 the outer diameter of block 30' is significantly smaller, whereas the number and diameter of bores 32' is unchanged with respect to FIG. 5. The cross-sectional area portion of bores 32' is, hence, significantly higher. It amounts to approximately 44% as compared to about 24% of the embodiment of FIG. 5.

The higher density of the bores becomes also apparent in the embodiment of FIG. 7 where 19 such bores 32" are altogether arranged within block 30".

Finally FIG. 8 shows still another alternate embodiment in which block 30''' is not configured cylindrically but flatly or elongate instead and is also provided with a plurality of bores 32'''.

Other alternate designs may easily be configured and e.g. also depend from the particular design of the respective resonator.

The inventive probe head may be used advantageously for industrial applications, in particular for the example presented above in more detail, i.e. the investigation of the imperishability of beer. However, the invention is not at all restricted to that application. Instead, it may generally be used for fermented liquids, e.g. for wine or diary products.

For the illustration of this method, reference is now first made to FIG. 9.

Reference numeral 40 as a whole shows an ESR spectrometer modified in the meaning of the present invention and which is, therefore, particularly adapted and intended for executing the inventive method.

Spectrometer 40 comprises in a conventional manner a magnet system 42 receiving a resonator 10. A microwave line 44 interconnects resonator 10 with a spectrometer control unit 46.

Resonator 10 receives sample vessel 22 being configured as explained above and, in the shown example, is connected as a flow cell.

As a consequence, a feed line 48 is connected from above to sample vessel 22 in FIG. 9. Feed line 48 is connected to an output 49 of a first sampler 50. The term "sampler" is to be understood to mean an apparatus in which substances may be conveyed between various sample containers. A sampler has a plurality of connecting lines, valves, pumps and control units for configurating any conceivable: flow path between predetermined inputs and predetermined outputs according to a predetermined program.

In FIG. 9 first sampler 50 is connected with spectrometer control unit 46 via a first control line 52.

First sampler 50 has a total of n inputs 54/1 through 54/n, six of which, namely 54/1 through 54/6 being shown in detail.

Suction lines 56/1 through 56/n are connected to inputs 54/1 through 54/n. Suction lines 56/1 through 56/n are connected to containers 58/1 through 58/n. Containers 58 are all located within a thermostat 59. Thermostat 59 is configured such that a temperature lying well above room temperature may be set in all containers 58, the elevated temperature lying, for example, within the range of between 50° C. and 70° C.

For executing the inventive method, the first containers 58 are filled with the liquid foodstuffs or the fermented liquid, respectively, in particular with beer. The sample substance had been provided with a spin-trap or a spin-label substance beforehand or did already comprise such a substance intrinsically.

First sampler 50, moreover, has a second input 60 being connected via a second suction line 62 to a second container 64. Second container 64 is preferably essentially smaller than the first container 58. In the embodiment shown it contains a rinsing liquid.

By appropriately controlling first sampler 50 via control line 52, control unit 46 may effect that liquid is sucked from one of the containers 58/1 through 58/n or from container 64 and is fed to output 49.

In FIG. 9 one may see a discharge line 66 at the lower side of resonator 10. Discharge line 66, via a pump 68, in particular a peristaltic pump, is connected to a drain 70. Drain 70, in turn, is connected to a conventional drain system (not shown).

In an alternate embodiment of the invention, a second sampler 72 may be provided at the output of pump 68. Second sampler 72 is essentially configured same as first sampler 50. Via discharge line 66' the liquid discharged from sample container 22 is fed to second sampler 72. Via recirculation lines 73 being connected to the output of a second sampler 72, the discharged liquid may now be recirculated to one of the containers 58/1 through 58/n or to second container 64 under appropriate control.

Therefore, whereas in the first mentioned case the samples measured within resonator 10 are disposed of via pump 68 after having been discharged, they are recirculated in the second mentioned case via second sampler 72 into their initial containers.

For explaining the inventive method, reference shall now be made to the depiction of FIGS. 10A through 10G.

Insofar, FIGS. 10A through 10F show six diagrams in which an intensity I of the ESR signal measured within resonator 10 is plotted along the ordinate direction whereas time t is plotted along the abscissa direction. In connection therewith FIG. 10G shows various moments in time $t_1$ through $t_{13}$ that will be discussed hereinafter. These moments in time are the same for all depictions in FIGS. 10A through 10F.

Figure 10A:
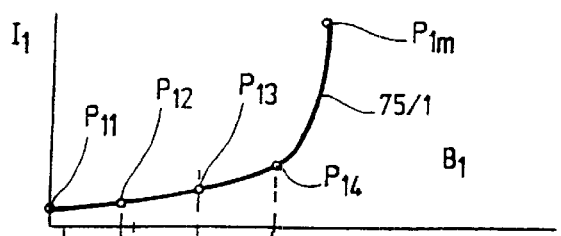

In FIG. 10A a first diagram 75/1 is plotted. Diagram 75/1 comprises a curve rising slowly from a first point $P_{11}$ over a second point $P_{12}$ and a third point $P_{13}$ to a fourth point $P_{14}$. It then shows a superproportional increase at a moment in time $t_0$.

After fourth point $P_{14}$ several further measuring points (not shown) follow until finally after m measurements diagram 75/11 ends at m-th point $P_{1m}$.

As results from the three printed publications mentioned at the outset of the present application, diagram 75/11 is characteristic for the measurement of the imperishability of beer. Namely, a thermally stressed beer sample in subsequent measurements first shows a slow increase in the intensity I of the ESR signal, whereas from a certain moment in time on (here: $t_0$) the increase grows superproportionally. The position of that moment in time $t_0$ is a measure for the imperishability of the beer.

For the further explanation it is assumed that with the arrangement shown in FIG. 9 six distinct kinds of beers from the six containers 58/1 through 58/6 shall be measured in parallel. The six kinds of beer are designated as $B_1$ through $B_6$ in the depictions of FIGS. 10A through 10F.

The measuring program starts at $t_1$ (FIG. 10G). At moment in time $t_1$ an appropriate control of first sampler 50 effects that a first sample is taken from first container 58/1 receiving beer $B_1$. Sample container 22 within resonator 10 is filled with that sample. The subsequent ESR measurement reveals an intensity $I_1$ being plotted as a first measuring point $P_{11}$ in diagram 75/1 of FIG. 10A.

After the completion of this first measurement having required a period of time Δt (FIG. 10B), sample container 22 is discharged, wherein the sample is either disposed of in drain 70 or is recirculated via second sampler 72 into first container 58/1. It would be appropriate to rinse sample vessel 22 thereafter by sending a corresponding amount of rinsing fluid from second container 64 via first sampler 50 through sample vessel 22. The rinsing liquid is then discharged into drain 70 (or 70', respectively).

For the subsequent measurement a sample is taken from a second container 58/2 containing beer $B_2$. The subsequent ESR measurement reveals an intensity $I_2$ being plotted as measuring point $P_{21}$ in diagram 75/2 of FIG. 10B. Accordingly, for any kind of beer $B_1$ through $B_6$ an individual diagram 75/1 through 75/6 is plotted.

Figure 10B:
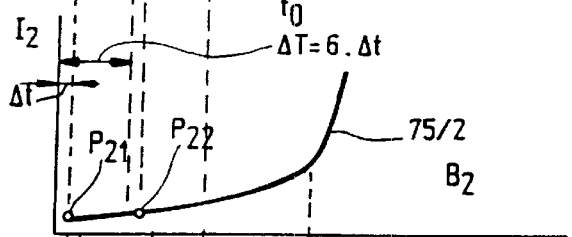
Figure 10C:
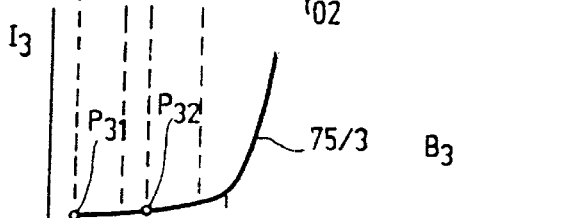
Figure 10D:
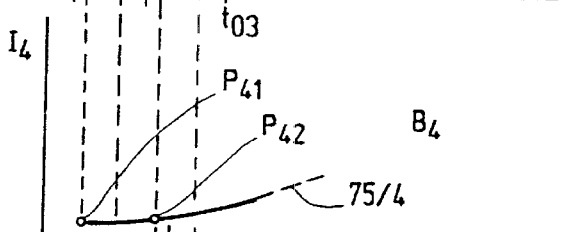
Figure 10E:
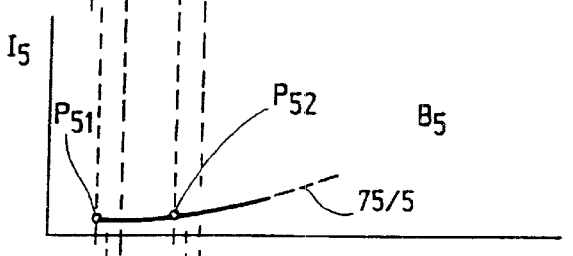
Figure 10F:
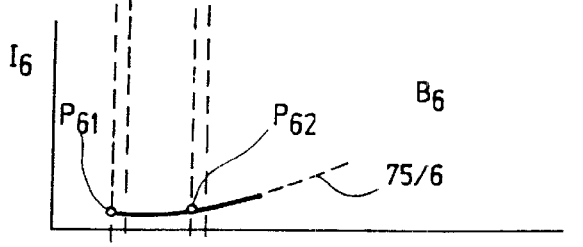
Figure 10G:
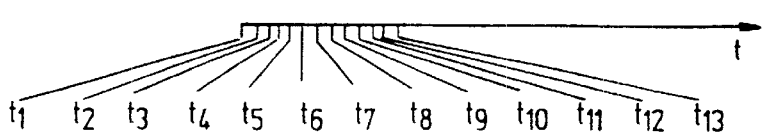

Assuming that all measuring processes are effected at the same speed, a subsequent measurement for the respective next kind of beer may be effected after the same period of time Δt. Measuring point $P_{21}$ in FIG. 10B is, hence, followed, after Δt has lapsed, by measuring point $P_{31}$ in FIG. 10C, then measuring point $P_{41}$ in FIG. 10D, then a measuring point $P_{51}$ in FIG. 10E and finally a measuring point $P_{61}$ in FIG. 10F. Now all six kinds of beer $B_1$ through $B_6$ have been measured by one measuring point $P_{11}$ through $P_{61}$ each.

After another period of time Δt a second measuring point of the first kind of beer $B_1$ may be measured by again taking a sample from first container 58/1 via first sampler 50. The corresponding measuring point is indicated with $P_{12}$ in FIG. 10A.

The time interval between measuring points $P_{11}$ and $P_{12}$ in FIG. 10A is indicated with ΔT. In the embodiment shown ΔT is six times as long as Δt because six kinds of beer as a whole shall be measured one after the other.

As is well known from the competent literature, as mentioned at the outset, the intensity diagram varies only slightly initially so that sufficient time may pass between the individual measuring points ($P_{11}$-$P_{12}$-$P_{13}$), for example five or ten minutes. Whereas in conventional measurements the measuring apparatus was not used during these intermissions, the inventive method achieves in the described manner that these measuring intermissions may be utilized for measuring further samples of other kinds of beer. Depending on the particular case one may interlock in time so many parallel measurements that the intervals ΔT attain the maximum allowable dimension.

In the manner described before the measurement goes on cyclically so that after the first measuring points $P_{11}$ through $P_{61}$ of the six kinds of beer $B_1$ through $B_6$ second measuring points $P_{12}$ through $P_{62}$ are measured and then third measuring points $P_{13}$ ... etc., until finally after m measuring points the last measuring points $P_{1m}$ through $P_{6m}$ are measured and, hence, six diagrams as a whole are available and, hence, six entire measurements.

One may take from the depiction of FIG. 10G that the individual measurements are made with the same time interval therebetween, the first measuring cycle of the first points $P_{11}$ through $P_{61}$ being terminated at $t_6$ and the second cycle being terminated at $t_{12}$ so that at $t_{13}$ the third measuring point $P_{13}$ may be measured in the first diagram 75/1.

Of course, modifications are possible in so far that in particular when strongly different kinds of beer shall be measured, the individual measuring times may be set differently. However, this does not alter the principle of the inventive method.

What is claimed is:

1. A method for investigating the imperishability of liquid foodstuffs by means of electron spin resonance (ESR), wherein a sample of the foodstuff is exposed to an elevated temperature, as compared to room temperatures, for an extended period of time, wherein during the period of time an ESR signal of the sample is measured in predetermined time intervals (ΔT), the intensity (I) of the ESR signal is plotted vs. time and the moment in time ($t_{01}$, $t_{02}$, $t_{03}$) is detected when the Intensity (I) shows a super proportional increase, wherein a predetermined number n of samples each of different foodstuffs is investigated interlocked in time relative to each other by executing the following steps within a same sample container (22):

a) filling a first sample of a first foodstuff into the sample container (22);

b) investigating the first sample by means of ESR and measuring the intensity (I) of the ESR signal;

c) plotting the intensity (I) measured in step b) as a first measuring point ($P_{11}$) in a first diagram (75/1);

d) discharging the first sample of the first foodstuff;

e) repeating n−1 times steps a) through d) with the n−1 samples of the foodstuffs, wherein in step c) the measured intensities of each foodstuff are plotted into separate diagrams (75/2 through 75/n) as first points ($P_{21}$ through $P_{n1}$), the number n being dimensioned such that executing steps a) through d) n times corresponds essentially to the predetermined time interval ($\Delta T$);

f) filling a second sample of the first foodstuff in to the sample container (22);

g) investigating the second sample by means of ESR and measuring the intensity (I) of the ESR signal;

h) plotting the intensity measured in step g) as a second measuring point ($P_{12}$) into the first diagram (75/1);

i) discharging the second sample;

j) repeating n−1 times steps e) through i) with the n−1 samples of the n−1 other foodstuffs, wherein in step h) the measured intensities of each foodstuff are plotted into separate diagrams (75/2 through 75/n) as second points ($P_{22}$ through $P_{n2}$) into the separate diagrams and k) repeating steps e) through j) for third and more measuring points until a predetermined number m of measuring points per diagram has been attained.

2. The method of claim 1, characterized in that a spin-trap substance is added to the sample beforehand.

3. The method of claim 1, characterized in that a spin-label substance is added to the sample beforehand.

4. The method of claim 1, characterized in that an intrinsic substance is added to the sample beforehand.

5. The method of claim 1, characterized in that in steps d) and i) the samples are recirculated after discharging, such that all samples of a specific foodstuff are represented by the same sample.

6. The method of claim 1, characterized in that in steps d) and i) the samples are disposed of after discharging, such that the samples of a specific foodstuff are taken as individual samples from a supply of the specific foodstuff.

7. The method of claim 1, characterized in that the sample vessel (22) is rinsed after step d) and/or i).

8. The method of claim 1, characterized in that the samples are measured in a resonator (10) adapted to allow propagation of an electromagnetic field (H, E), the sample vessel (22) being elongate and being located within the resonator along the direction of the magnetic rf field strength (Hx) at the location of minimum electric rf field strength (Hx, Ey), that the foodstuff sample contained in the sample vessel (22) has minimum dimensions in the direction of increasing electric rf field strength (Ey), and that the samples are measured in a sample vessel (22) having a plurality of elongate sample areas with minimum radial dimensions.

9. The method of claim 8, characterized in that the sample areas are arranged parallel, and that the sample is filled into one end of the sample areas and is discharged from the opposite end of the sample areas.

10. The method of claim 8, characterized in that the sample areas are arranged in series, and that the sample is filled into an open end of the first sample area within the series and is discharged from the open end of the last sample area within the series.

11. The method of claim 1, characterized in that the liquid foodstuff is beer.

12. An apparatus for investigating the imperishability of liquid foodstuffs by means of electron spin resonance (ESR), wherein a sample of the foodstuff is exposed to an elevated temperature, as compared to room temperatures, for an extended period of time, wherein during the period of time an ESR signal of the sample is measured in predetermined time intervals ($\Delta T$), the intensity (I) of the ESR signal is plotted vs. time and the moment in time ($t_{o1}$, $t_{o2}$, $t_{o3}$) is detected when the Intensity (I) shows a superproportional increase, wherein for investigating in a manner interlocked in time relative to each other a predetermined number n samples each of different foodstuffs a same sample container (22) is provided, and that the apparatus comprises:

a) means for filling a first sample of a first foodstuff into the sample container (22);

b) means for investigating the first sample by means of ESR and measuring the intensity (I) of the ESR signal;

c) means for plotting the intensity (I) measured in step b) as a first measuring point ($P_{11}$) in a first diagram (75/1);

d) means for discharging the first sample of the first foodstuff;

e) means for repeating n−1 times steps a) through d) with the n−1 samples of the other n−1 foodstuffs, wherein in step c) the measured intensities of each foodstuff are plotted into separate diagrams (75/2 through 75/n) as first points ($P_{21}$ through $P_{n1}$), the number n being dimensioned such that executing steps a) through d) n times corresponds essentially to the predetermined time interval ($\Delta T$);

f) means for filling a second sample of the first foodstuff in to the sample container (22);

g) means for investigating the second sample by means of ESR and measuring the intensity (I) of the ESR signal;

h) means for plotting the intensity measured in step g) as a second measuring point ($P_{12}$) into the first diagram (75/1);

i) means for discharging the second sample;

j) means for repeating n−1 times steps e) through i) with the n−1 samples of the n−1 other foodstuffs, wherein in step h) the measured intensities of each foodstuff are plotted into separate diagrams (75/2 through 75/n) as second points ($P_{22}$ through $P_{n2}$) into the separate diagrams and k) means for repeating steps e) through j) for third and more measuring points until a predetermined number m of measuring points per diagram has been attained.

13. The apparatus of claim 12, characterized in that a spin-trap substance is added to the sample beforehand.

14. The apparatus of claim 12, characterized in that a spin-label substance is added to the sample beforehand.

15. The apparatus of claim 12, characterized in that an intrinsic substance is added to the sample beforehand.

16. The apparatus of claim 12, characterized by means which in steps d) and i) recirculate the samples after discharging, such that all samples of a specific foodstuff are represented by the same sample.

17. The apparatus of claim 12, characterized by means which in steps d) and i) dispose of the samples after discharging, such that the samples of a specific foodstuff are taken as individual samples from a supply of the specific foodstuff.

18. The apparatus of claim 12, characterized by a resonator (10) adapted to allow propagation of an electromagnetic field (H, E), the sample vessel (22) being elongate and being located within the resonator along the direction of the magnetic rf field strength (Hx) at the location of minimum electric rf field strength (Hx, Ey), that the foodstuff sample contained in the sample container (22) has minimum dimensions in the direction of increasing electric rf field strength (Ey), and that the samples are measured in a sample container (22) having a plurality of elongate sample areas with minimum radial dimensions.

19. The apparatus of claim 12, characterized in that the sample vessel (22*a*) comprises a block (30) having a plurality of axial bores (32).

20. The apparatus of claim 19, characterized in that the block (30, 30', 30") is essentially cylindrical.

21. The apparatus of claim 19, characterized in that the block (30''') is essentially flat.

22. The apparatus of claim 12, characterized in that the sample vessel (22b) comprises a bundle of capillaries.

23. The apparatus of claim 12, characterized in that the ratio of the sum of the radial cross-sectional areas of the sample areas and the entire cross-sectional area of the sample vessel (22) is between 0.2 and 0.6.

24. The apparatus of claim 12, characterized in that the sample areas are essentially cylindrical.

25. The apparatus of claim 24, characterized in that at a frequency of the electromagnetic field (H, E) of about 10 GHz (X-Band) the diameter of the sample areas is between 0.3 and 1.0 mm, preferably between 0.5 and 0.8 mm.

26. The apparatus of claim 25, characterized in that for an essentially cylindrical sample vessel (22) the outer diameter is between 2.5 and 5 mm, preferably between 2.8 and 3.8 mm.

27. The apparatus of claim 26, characterized in that seven or nineteen sample areas are provided within the sample vessel (22) in a hexagonal dense packing.

28. The apparatus of claim 12, characterized in that means for rinsing the sample areas are associated to the sample vessel (22).

29. The apparatus of claim 18, characterized in that the sample areas are arranged parallel such that the sample may be filled into one end of the sample areas and is discharged from the opposite end of the sample areas.

30. The apparatus of claim 18, characterized in that the sample areas are arranged in series, and that the sample may be filled into an open end of the first sample area within the series and is discharged from the open end of the last sample area within the series.

31. The apparatus of claim 29, characterized in that a pump (68) is connected to the discharge end of the sample areas.

32. The apparatus of claim 31, characterized in that the pump (68) is a peristaltic pump.

33. The apparatus of claim 29, characterized in that the filling-in end of the sample areas is connected to an output (49) of a sampler (50), and that inputs (54/1 through 54/n) of the sampler (50) are connected to a plurality of containers (58/1 through 58/n) being filled with different foodstuffs.

34. The apparatus of claim 33, characterized in that a further input (60) of the sampler (50) is connected to a container (64) adapted to be filled with a rinsing liquid.

\* \* \* \* \*

UNITED STATES PATENT AND TRADEMARK OFFICE
CERTIFICATE OF CORRECTION

PATENT NO.   : 6,462,546 B1
DATED        : October 8, 2002
INVENTOR(S)  : Dieter Schmalbein et al.

It is certified that error appears in the above-identified patent and that said Letters Patent is hereby corrected as shown below:

<u>Column 5,</u>
Line 32, "sample s" should read -- samples --.

Signed and Sealed this

Sixteenth Day of September, 2003

JAMES E. ROGAN
*Director of the United States Patent and Trademark Office*